United States Patent [19]
LaRosa et al.

[11] Patent Number: 5,661,433
[45] Date of Patent: Aug. 26, 1997

[54] DIGITAL FM DEMODULATOR

[75] Inventors: Christopher Peter LaRosa, Lake Zurich; Michael John Carney, Mundelein, both of Ill.

[73] Assignee: Motorola, Inc., Schaumburg, Ill.

[21] Appl. No.: 671,036

[22] Filed: Jun. 27, 1996

[51] Int. Cl.[6] ................................... H03D 3/00
[52] U.S. Cl. .................. 329/341; 455/214; 455/337
[58] Field of Search ................ 329/315, 341–343; 331/23; 455/205, 210–211, 214, 337

[56] References Cited

U.S. PATENT DOCUMENTS

| | | | |
|---|---|---|---|
| 4,839,606 | 6/1989 | Hallock | 329/107 |
| 4,875,017 | 10/1989 | Sakazaki | 329/336 |
| 4,884,037 | 11/1989 | Sogo | 329/336 |
| 5,084,669 | 1/1992 | Dent | 324/830 |
| 5,159,281 | 10/1992 | Hedstrom et al. | 329/312 |
| 5,202,901 | 4/1993 | Chennakeshu et al. | 375/84 |
| 5,289,505 | 2/1994 | LaRosa et al. | 375/83 |
| 5,299,232 | 3/1994 | LaRosa et al. | 375/99 |
| 5,329,242 | 7/1994 | Myers | 329/300 |
| 5,367,538 | 11/1994 | LaRosa et al. | 375/82 |
| 5,436,589 | 7/1995 | LaRosa et al. | 329/302 |
| 5,461,643 | 10/1995 | LaRosa et al. | 375/329 |

*Primary Examiner*—David Mis
*Attorney, Agent, or Firm*—Sylvia Chen

[57] ABSTRACT

In the digital FM demodulator (330), a hard limiter (333) receives a modulated analog IF signal and limits the voltage of the IF signal to two levels. Next, a direct phase digitizer (336) uses zero-crossings of the limited IF signal to generate N-bit digital words. A phase differential circuit (340) computes the phase shift of the signal from the direct phase digitizer over a predetermined time interval. The dynamic range of the phase differential signal can be increased by replacing the phase differential circuit (340) with a high-resolution phase differential circuit (700). After digital demodulation and filtering and gain control by audio processor (360), the recovered signal is forwarded to a speaker (390) to produce an audio output. Thus, the digital FM demodulator both avoids problems common to analog discriminator circuitry and offers a reduced complexity, size, and power consumption alternative to conventional digital FM demodulators.

20 Claims, 5 Drawing Sheets

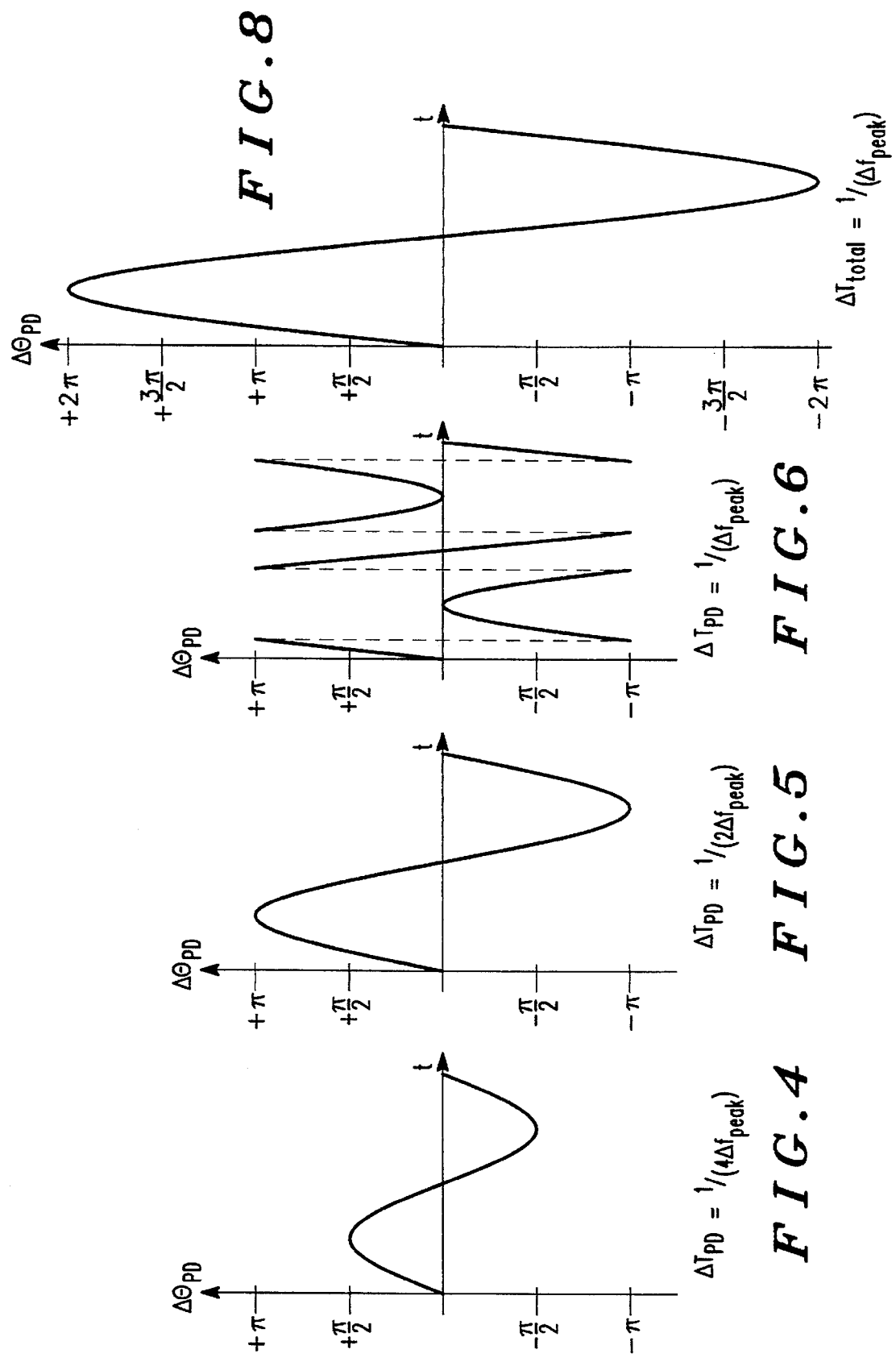

5,661,433

1

DIGITAL FM DEMODULATOR

FIELD OF THE INVENTION

This invention relates generally to frequency modulation (FM) demodulators, and more particularly to a digital FM demodulator with reduced complexity, size, and power consumption.

BACKGROUND OF THE INVENTION

Frequency modulation (FM) is one of the most common methods of transmitting analog voice signals across a communication channel. This method has been used in a wide variety of applications including cellular communications systems in the United States, Japan, and Europe.

A conventional analog approach to demodulating FM signals employs a discriminator followed by baseband audio processing. Although analog FM demodulators are adaptable to portable applications such as cellular communications, this approach has several drawbacks due to the tuning requirements of the analog discriminator and the direct current (DC) offsets inherent in analog circuitry.

A digital approach to FM demodulation, on the other hand, avoids the aforementioned problems of analog discriminator circuitry. A conventional digital FM demodulator requires a high-speed analog-to-digital (A/D) conversion of intermediate frequency (IF) or baseband in-phase and quadrature (I/Q) signals. After conversion to the digital domain, digital signal processing (DSP) circuitry extracts the modulating signal from the digital information. Unfortunately, size and current drain requirements typically render conventional digital FM demodulators impractical for low-cost, portable applications.

Thus, there is a need for an FM demodulator that not only avoids the problems common to analog discriminator circuitry, but also offers a reduced size and power consumption alternative to conventional digital FM demodulators.

BRIEF DESCRIPTION OF THE DRAWINGS

FIG. 4 shows a graph of a recovered signal from a digital FM demodulator according to a preferred embodiment using a first delay interval.

FIG. 5 shows a graph of a recovered signal from a digital FM demodulator according to a preferred embodiment using a second delay interval.

FIG. 6 shows a graph of a recovered signal from a digital FM demodulator according to a preferred embodiment using a third delay interval.

FIG. 8 shows a graph of a recovered signal from a digital FM demodulator according to a preferred embodiment using a high resolution phase differential circuit according to a preferred embodiment with a single range expansion stage.

DETAILED DESCRIPTION OF THE PREFERRED EMBODIMENT

A digital FM demodulator eliminates the A/D conversion and DSP requirements of conventional digital FM demodulator approaches. Because this high-speed processing is no longer required, the digital FM demodulator and any associated modem functions can be readily integrated into a custom integrated circuit for use in an application such as a radiotelephone. Thus, the digital FM demodulator not only avoids the inherent problems common to analog discriminator circuitry, but it also offers a reduced complexity, size, and power consumption alternative to conventional digital FM demodulators.

In the digital FM demodulator, a hard limiter receives an IF signal and limits the voltage of the IF signal to two levels which correspond to a logic level 0 and a logic level 1. Next, a direct phase digitizer (DPD) uses zero-crossings of the limited IF signal to generate N-bit digital words. A phase differential circuit computes the phase shift of the signal from the DPD over a predetermined time interval. This phase differential signal provides a digital representation of the transmitted analog modulating signal. As an option, the dynamic range of the phase differential signal can be increased by using one or more range expansion stages. After digital audio processing or digital-to-analog (D/A) conversion and analog audio processing, the phase differential signal with (or without) increased resolution can be forwarded to a speaker to produce an audio output.

Figure 1:
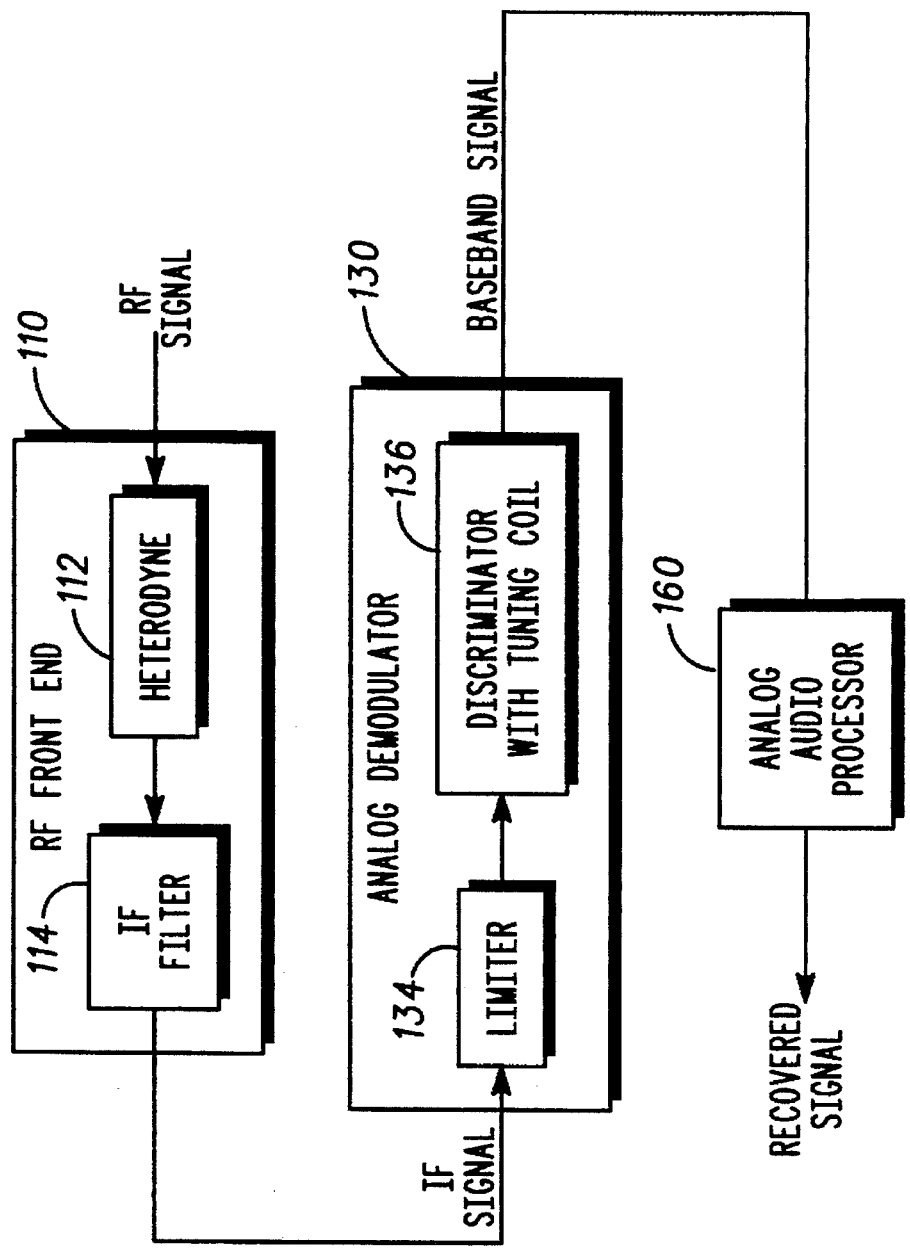
FIG. 1 shows a block diagram of a prior art FM receiver with an analog demodulator.

FIG. 1 shows a block diagram of a prior art FM receiver with an analog demodulator. In this FM receiver, radio frequency (RF) front end 110 steps down an input RF signal to an intermediate frequency using heterodyne circuit 112, and IF filter 114 limits the input noise level of the IF signal by eliminating frequency bands that are not of interest. In analog demodulator 130, the output of IF filter 114 is passed to limiter 134, which removes noise-induced amplitude modulation from the received IF signal. Next, discriminator with tuning coil 136 converts frequency deviations in the limited IF signal to voltage level deviations, which creates a baseband signal. Analog audio processor 160 filters and adjusts the gain of the varying voltage signal to produce a recovered signal; analog audio processor 160 typically uses switched-capacitor filter technology.

The problems inherent in this approach center around the discriminator coil, which must be tuned on a factory line to obtain optimal performance for each receiver. This discriminator coil has an inherent DC offset that varies from receiver to receiver, making accurate frequency control difficult to achieve. Finally, while improvements in circuit integration processes contribute to receiver size reductions, the coil remains as one of the larger elements in existing analog receivers.

Figure 2:
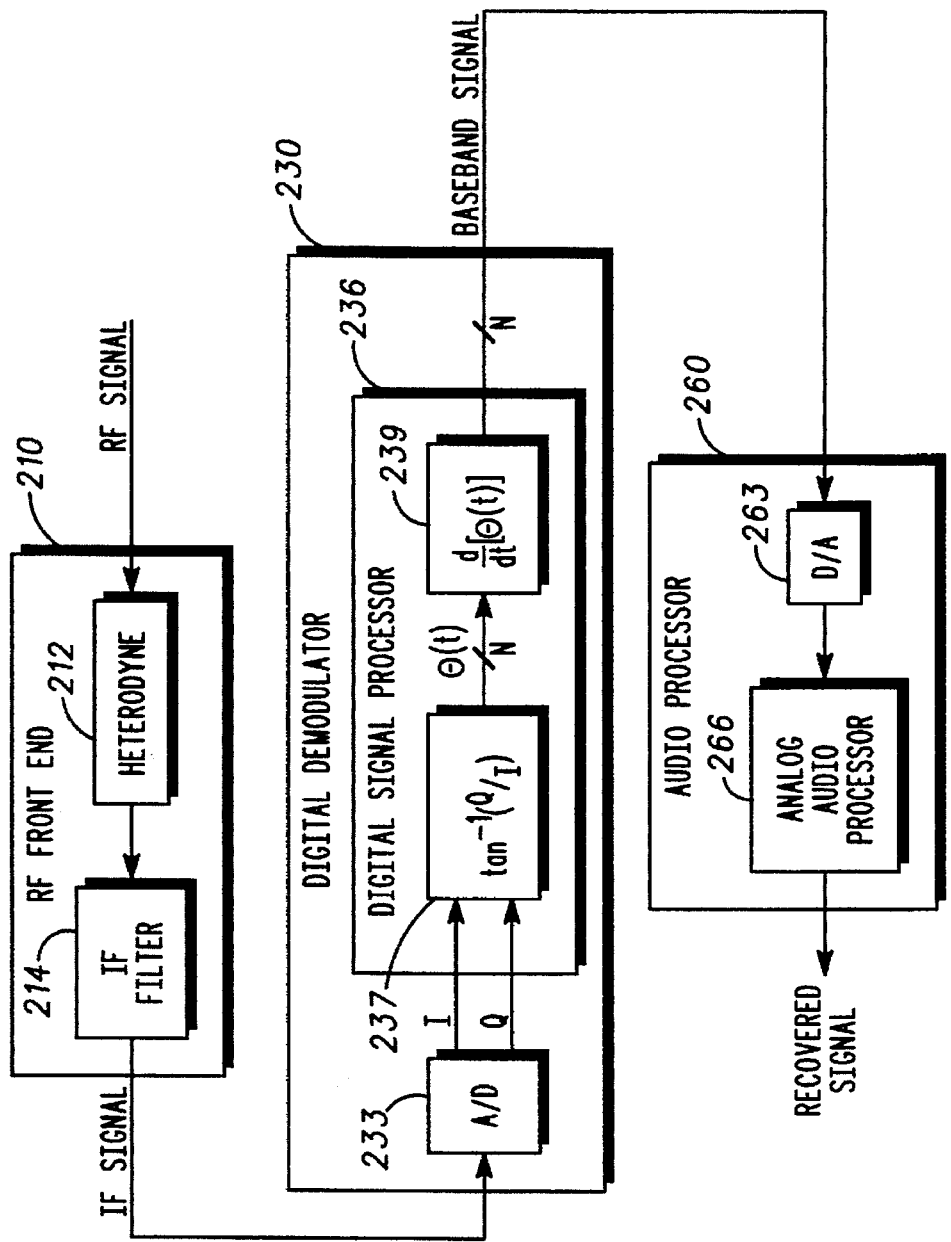
FIG. 2 shows a block diagram of a prior art FM receiver with a digital demodulator.

FIG. 2 shows a block diagram of a prior art FM receiver with a digital demodulator. An RF front end 210, similar to the RF front end described previously, includes a heterodyne circuit 212 and an IF filter 214 for stepping down an input RF signal to an intermediate frequency and filtering it. In digital demodulator 230, an A/D converter 233 with a high clock speed converts the analog IF signal to digital in-phase and quadrature (I/Q) signals. High-speed DSP 236 includes arctangent block 237, which computes or looks up phase information responsive to the I and Q signals, and differentiation block 239, which performs high-speed differentiation of the phase information to produce a digital output signal containing desired frequency information. Audio processor 260 includes D/A converter 263, to convert the digital output signal of the digital demodulator 230 to the analog domain, and analog audio processor 266, to filter and amplify the analog input signal to produce a recovered signal.

This digital demodulation approach eliminates the problems associated with an analog demodulator having a discriminator coil; however, the high-speed DSP requirements in this digital approach typically result in increased receiver size and power consumption, which is undesirable in space and power critical applications.

Figure 3:
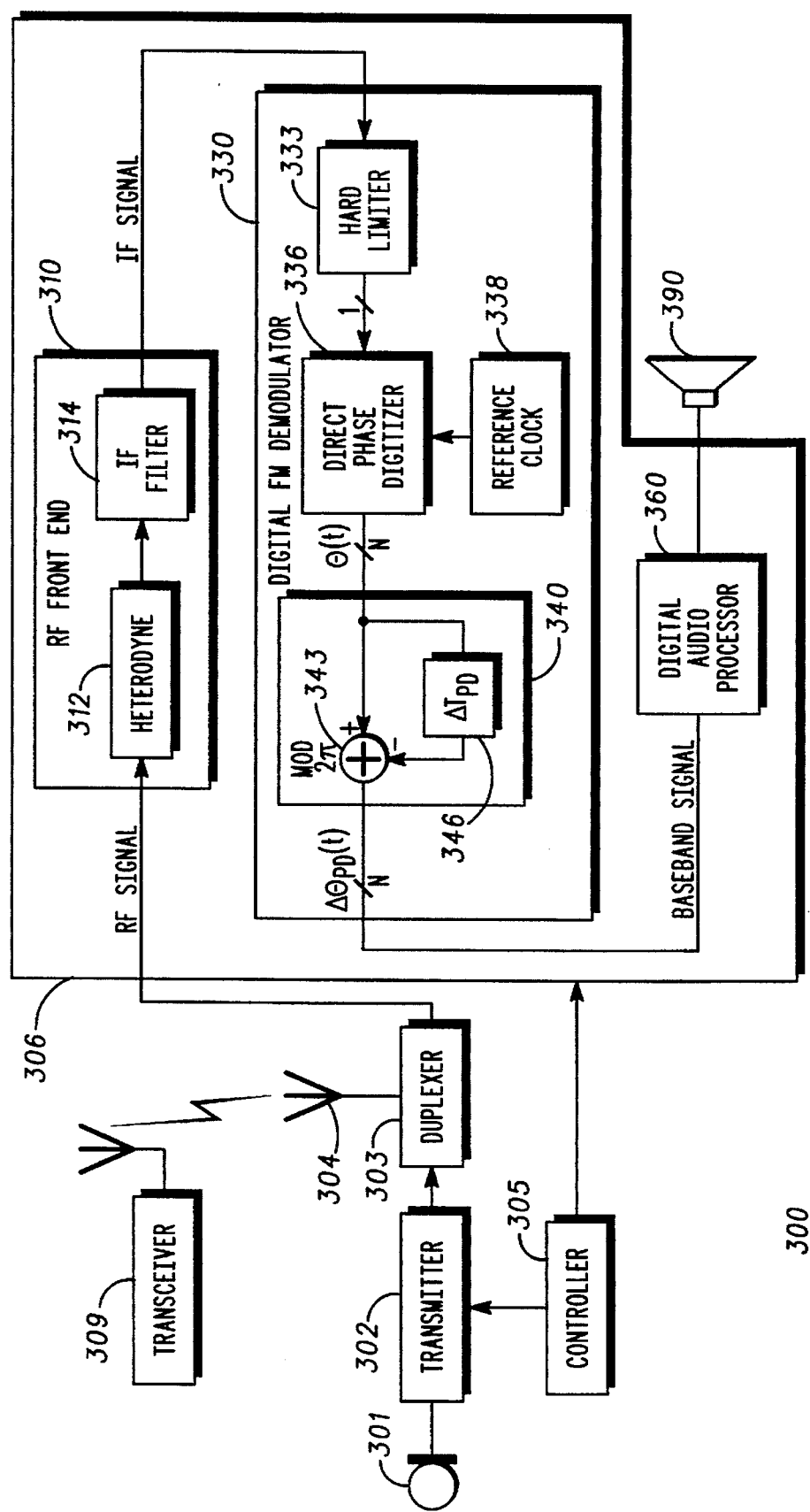
FIG. 3 shows a block diagram of an FM receiver with a digital FM demodulator according to a preferred embodiment as implemented in a receiver of a communication device.

FIG. 3 shows a block diagram of an FM receiver with a digital demodulator according to a preferred embodiment as implemented in a receiver of a communication device. The illustrated communication device 300 having a digital FM demodulator 330 is a radiotelephone; however, the digital FM demodulator 330 can be employed in a MODEM (modulator/demodulator), two-way radio, land-line telephone, recording instrument, cellular telephone, cordless telephone, radio frequency receiver, or any other analog receiver device.

Transmitter 302 and receiver 306 in communication device 300 operate under the control of a controller 305, which can be implemented using a microprocessor, a digital signal processor, or the like. An antenna 304 is coupled to both transmitter 302 and receiver 306 via a duplexer 303. Antenna 304 emits signals generated by transmitter 302 from microphone 301 for transmission to a complementary communication device 309 with a transceiver and an antenna. Antenna 304 also receives radio frequency signals imparted to communication device 300 from the complementary communication device 309.

In the receiver 306, RF front end 310 having a heterodyne circuit 312 and IF filter 314 receives a modulated input RF signal from a complementary communication device through antenna 304 and duplexer 303. RF front end 310 produces an analog IF signal having a frequency deviation proportional to the modulating signal. In digital FM demodulator 330, the IF signal is amplified and limited to two voltage levels by hard limiter 333. Note that hard limiter 333 replaces the A/D converter 233 shown in FIG. 2, and the output of the hard limiter 333 is interpreted as a one-bit digital signal. Next, DPD circuit 336 uses a high-frequency reference clock 338 to estimate the time between zero-crossings of the limited IF signal. This estimate is mapped into an N-bit word θ(t) representing the phase of the limited IF signal relative to reference clock 338. Because phase information is extracted directly from the limited IF signal, no dedicated A/D converter is required which reduces the size and current drain of the digital FM demodulator 330 relative to conventional digital demodulator approaches.

DPD circuit 336 internally generates an updated phase word at each zero-crossing of the IF input. At this point, interpolation may be utilized to provide enhanced time resolution. For FM applications, the signal at the input to the limiter can be represented as:

$$A(t)\cos\left[\omega_{IF}t + 2\pi\Delta f_{peak}\int_{-\infty}^{t} m(t)dt\right] \quad (1)$$

where m(t) is the modulating waveform. The resulting phase signal from equation (1) extracted by the DPD circuit can be represented as:

$$\theta(t) = 2\pi\Delta f_{peak}\int_{-\infty}^{t} m(t)dt \quad (2)$$

This N-bit word is then sampled-and-held at a predetermined rate $1/\Delta T_{PD}$ that is system-specific. A method of determining time interval $\Delta T_{PD}$ will be discussed later.

Other methods may be used to produce the digital phase signal θ(t). For instance, arctangent block 237 shown in FIG. 2 also produces a digital phase signal θ(t), and the A/D converter 233 and arctangent block 237 of FIG. 2 can be substituted for the hard limiter 333 and DPD circuit 336 with reference clock 338 shown in FIG. 3.

Phase differential circuit 340 having delay block 346 and modulo-2π adder 343 performs a differential operation to compute the phase shift $\Delta\theta_{PD}(t)$ of the received digital phase signal θ(t) over predetermined time interval $\Delta T_{PD}$. This operation can be regarded as a coarse approximation to mathematical differentiation. Of course, other methods may be substituted to approximate mathematical differentiation. A mathematical differentiation of the phase signal of equation (2) results in the modulating signal m(t) scaled by a deviation constant:

$$[2\pi\Delta f_{peak}]m(t) \quad (3)$$

The phase differential circuit 340 output, however, is:

$$\Delta\theta_{PD}(t) \approx \Delta T_{PD}[2\pi\Delta f_{peak}]m(t) \quad (4)$$

which is approximately equal to the result of mathematical differentiation shown in equation (3) scaled by the delay interval $\Delta T_{PD}$. The phase differential signal $\Delta\theta_{PD}(t)$ is accomplished by delaying a DPD output phase word by delay interval $\Delta T_{PD}$ using delay block 346 and then subtracting the result from the current DPD phase word θ(t) using modulo-2π adder 343. Delay block 346 can be implemented using a chain of D flip-flops.

A standard approach to reducing the delay interval $\Delta T_{PD}$ would be to perform the phase differential operation at a high clock rate (i.e., at a rate exceeding the IF zero-crossing rate). Indeed, as shown by equations (3) and (4), reducing the delay interval improves the approximation to mathematical differentiation. Equation (4), however, also illustrates that the maximum utilization of dynamic range, and consequently the maximum signal-to-noise ratio (SNR), is obtained if the delay interval $\Delta T_{PD}$ is made as large as possible. Because the phase differential circuit 340 output $\Delta\theta_{PD}(t)$ is quantized to N bits, the maximum SNR at the output of phase differential circuit 340 will be approximately 6N dB. Note that any increase in SNR occurs at a cost of increasing distortion of the phase differential signal $\Delta\theta_{PD}(t)$.

For a sinusoidal modulation signal represented by $m(t) = \sin\{2\pi f_m t\}$, the phase differential circuit 340 output corresponding to equation (4) can be expressed mathematically as $\Delta\theta_{PD}(t) \approx \Delta T_{PD}[2\pi\Delta f_{peak}]\sin\{2\pi f_m t\}$. FIGS. 4–6 show the output of the phase differential circuit 340 for three different delay intervals. FIG. 4 shows that one-half of the dynamic range can be utilized if the delay interval $\Delta T_{PD}=1/(4\Delta f_{peak})$. Increasing the delay interval by a factor of two to $\Delta T_{PD}=1/(2\Delta f_{peak})$ as shown in FIG. 5 effectively doubles the signal amplitude to allow full utilization of the dynamic range. The result is a 6 dB improvement in SNR. In fact, each factor-of-two increase in the delay interval produces a corresponding 6 dB improvement in SNR. A delay interval $\Delta T_{PD}=1/(2\Delta f_{peak})$ maximizes the SNR while maintaining an acceptable approximation to differentiation. The resulting phase differential circuit 340 output signal is a digital phase differential word that ranges in value from $-(2^N)/2$ to $[(2^N)/2]-1$, corresponding to a phase shift ranging from $-\pi$ to $+\pi$. As shown in FIG. 6, however, modulo-2π discontinuities will occur at the phase differential circuit 340 output if $\Delta T > 1/(2\Delta f_{peak})$. In this example, $\Delta T_{PD}=1/(\Delta f_{peak})$ causes significant distortion of the signal. A simple clipping circuit could be employed to prevent modulo-2π phase discontinuities at signal peaks at the expense of some distortion of the signal.

Returning to FIG. 3, the baseband signal from phase differential circuit 340 is sent to digital audio processor 360.

Digital audio processor 360 performs filtering and gain control on the digital phase differential signal and forwards the recovered signal to a speaker 390 to produce an audio output. Alternatively, filtering and gain control may be performed in the analog domain by replacing the digital audio processor 360 with a D/A converter followed by an analog audio processor.

Figure 7:
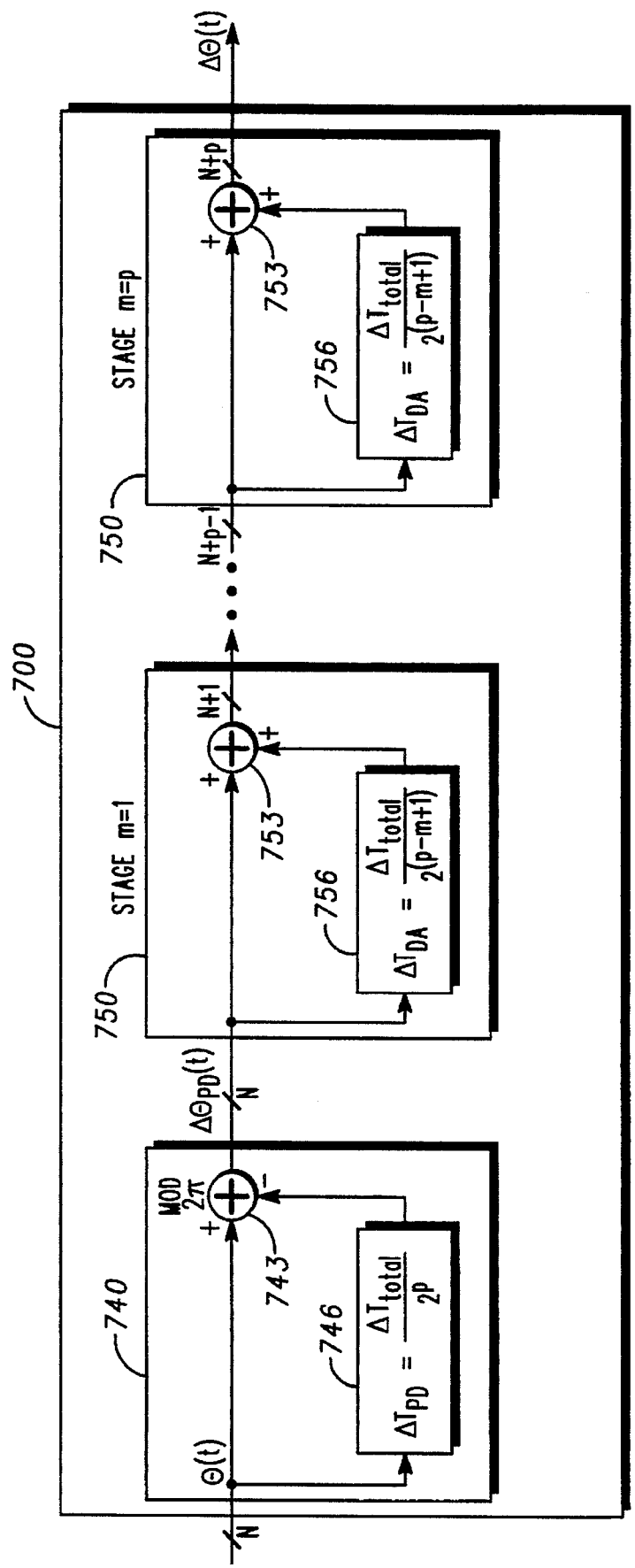
FIG. 7 shows a block diagram of a generalized high resolution phase differential circuit according to a preferred embodiment.

Replacing phase differential circuit 340 with high-resolution phase differential circuit 700 shown in FIG. 7 provides additional bits of resolution to the digital FM demodulator. Each additional bit of resolution results in a 6 dB improvement in SNR at the output of digital FM demodulator 330 shown in FIG. 3. High-resolution phase differential circuit 700 has a phase differential circuit 740 and one or more range expansion stages 750. Phase differential circuit 740 is similar to phase differential circuit 340 shown in FIG. 3 and includes modulo-$2\pi$ adder 743 and delay block 746. The recommended delay interval $\Delta T_{PD}$ of delay block 746, however, has been generalized to $\Delta T_{total}/2^P$, where $\Delta T_{total}$ is the total delay of high-resolution phase differential circuit 700 and p equals the total number of range expansion stages 750.

Each range expansion stage 750 includes delay block 756 and adder 753. By adding together two N-bit modulo-$2\pi$ phase differential output words, the first range expansion stage produces a modulo-$4\pi$ difference signal. As a result, the total delay interval $\Delta T_{total}$ of the high-resolution phase differential circuit 700 can be extended to $1/(\Delta f_{peak})$ without the aforementioned modulo-$2\pi$ discontinuities. An extra bit is furnished at the output of range expansion stage 750 to accommodate the modulo-$4\pi$ output signal. This extra bit of resolution, in conjunction with the extended delay interval, provides a 6 dB improvement in SNR. Replacing the phase differential circuit 340 shown in FIG. 3 with a high-resolution phase differential circuit 700 having only one range expansion stage 750, which produces N+1 bits of resolution, results in an output $\Delta\theta(t)$ as illustrated in FIG. 8. FIG. 5, on the other hand, shows the signal at the output of phase differential circuit 340 shown in FIG. 3 without a range expansion stage.

As shown in FIG. 7, additional range expansion stages 750 may be concatenated to phase differential circuit 740 depending on system parameters. The recommended delay interval $\Delta T_{DA}$ through each range expansion stage 750 is equal to $\Delta T_{total}/2^{(p-m+1)}$ where p equals the total number of range expansion stages and m equals the stage number. Each range expansion stage 750 adds an extra bit of resolution and provides an additional 6 dB improvement in SNR.

This approach of adding range expansion stages 750, however, is limited by the lowpass filtering that is inherently applied by each appended range expansion stage 750. Although increasing $\Delta T_{total}$ will improve the audio SNR, a null will appear in the spectrum of $\Delta\theta(t)$ at the frequency $1/(\Delta T_{total})$. To minimize distortion in the demodulated waveform, the relationship between the null frequency $1/(\Delta T_{total})$ and the maximum frequency component $f_{max}$ in the recovered signal must be constrained as follows:

$$1/(\Delta T_{total}) \gg f_{max}$$

Other demodulator functions, which are application-specific, may be added in the digital FM demodulator while the signal is still in the digital domain. For example, digital frequency control and audio enhancement algorithms may be implemented when using the digital FM demodulator with increased resolution in a MODEM.

Thus a digital FM demodulator retains the benefits of a conventional digital FM demodulators while reducing the size and power consumption of the demodulator circuit. While specific components and functions of the digital FM demodulator are described above, fewer or additional functions could be employed by one skilled in the art within the true spirit and scope of the present invention. The invention should be limited only by the appended claims.

We claim:

1. A digital FM demodulator comprising:

a converter, for converting a modulated analog signal to a digital phase signal; and a phase differential circuit connected to the converter, for producing a digital phase differential signal that approximates mathematical differentiation of the digital phase signal.

2. A digital FM demodulator according to claim 1 wherein the converter comprises:

a hard limiter, for limiting the modulated analog signal to create a limited signal having two voltage levels; and a direct phase digitizer connected to the hard limiter, for generating a digital phase signal responsive to the limited signal.

3. A digital FM demodulator according to claim 1 wherein the converter comprises:

an analog-to-digital converter, for converting the modulated analog signal to a digital in-phase signal and a digital quadrature signal; and an arctangent block connected to the analog-to-digital converter, for producing an arctangent of the digital quadrature signal divided by the digital in-phase signal to produce the digital phase signal.

4. A digital FM demodulator according to claim 1 wherein the phase differential circuit comprises:

an input;

a delay block connected to the input; and a modulo-$2\pi$ adder connected to the delay block and the input.

5. A digital FM demodulator according to claim 4 wherein the delay block delays a signal by a maximum time interval of half of the reciprocal of the peak frequency deviation.

6. A digital FM demodulator according to claim 1 further comprising:

a range expansion stage connected to the phase differential circuit, for increasing the dynamic range of the digital phase differential signal.

7. A digital FM demodulator according to claim 6 wherein the range expansion stage comprises:

an input;

a delay block connected to the input; and an adder connected to the delay block and the input.

8. A digital FM demodulator according to claim 6 wherein the total delay through the digital FM demodulator is approximately the reciprocal of the peak frequency deviation.

9. A digital FM demodulator according to claim 1 wherein the total delay through the digital FM demodulator is approximately the reciprocal of the peak frequency deviation.

10. An FM receiver comprising:

a radio-frequency front end, for producing an analog intermediate frequency signal from an analog radio frequency signal; and a digital FM demodulator connected to the radio-frequency front end comprising:

a hard limiter, for limiting an analog intermediate frequency signal to create a limited analog intermediate frequency signal having two voltage levels;

a direct phase digitizer connected to the hard limiter, for converting the limited analog intermediate frequency signal to a digital phase signal; and a phase differential circuit connected to the direct phase digitizer, for converting the digital phase signal to a digital phase differential signal.

11. An FM receiver according to claim 10 wherein the phase differential circuit comprises:

an input;

a delay block connected to the input; and a modulo-2π adder connected to the delay block and the input.

12. An FM receiver according to claim 11 wherein the delay block delays a signal by a maximum time interval of half of the reciprocal of the peak frequency deviation.

13. An FM receiver according to claim 10 further comprising:

a range expansion stage connected to the phase differential circuit, for increasing the dynamic range of the digital phase differential signal.

14. An FM receiver according to claim 13 wherein the range expansion stage comprises:

an input;

a delay block connected to the input; and an adder connected to the delay block and the input.

15. An FM receiver according to claim 13 wherein the total delay through the digital FM demodulator is approximately the reciprocal of the peak frequency deviation.

16. An FM receiver according to claim 10 wherein the total delay through the digital FM demodulator is approximately the reciprocal of the peak frequency deviation.

17. An FM receiver according to claim 10 further comprising:

a digital audio processor connected to the digital FM demodulator.

18. An FM receiver according to claim 10 further comprising:

a digital-to-analog converter connected to the digital FM demodulator; and an analog audio processor connected to the digital-to-analog converter.

19. A method for demodulating an analog signal comprising the steps of:

converting the analog signal to a digital phase signal; and producing a digital phase differential signal approximating mathematical differentiation of the digital phase signal.

20. A method for demodulating an analog signal according to claim 19 wherein the step of converting further comprises the steps of:

limiting the analog signal to a limited signal having two voltage levels; and converting the limited signal to the digital phase signal.

* * * * *